(12) United States Patent
Kitagawa et al.

(10) Patent No.: US 6,541,982 B2
(45) Date of Patent: Apr. 1, 2003

(54) PLASMA DENSITY MEASURING METHOD AND APPARATUS, AND PLASMA PROCESSING SYSTEM USING THE SAME

(75) Inventors: Hideo Kitagawa, Utsunomiya (JP); Nobumasa Suzuki, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/760,667

(22) Filed: Jan. 17, 2001

(65) Prior Publication Data

US 2001/0024114 A1 Sep. 27, 2001

(30) Foreign Application Priority Data

Jan. 17, 2000 (JP) ........................................ 2000-007949

(51) Int. Cl.⁷ ............................ G01N 27/62; C23C 16/00
(52) U.S. Cl. ................................... 324/464; 118/723 I
(58) Field of Search ............................ 324/464, 459, 324/463, 465; 118/723 I, 723 MW; 250/283; 315/111.21; 156/345.41

(56) References Cited

U.S. PATENT DOCUMENTS

| | | | | |
|---|---|---|---|---|
| 5,846,331 A | * | 12/1998 | Miyamoto | 118/723 I |
| 5,936,413 A | * | 8/1999 | Booth et al. | 250/283 |
| 6,290,807 B1 | * | 9/2001 | Matsumoto et al. | 118/723 MW |

FOREIGN PATENT DOCUMENTS

| | | |
|---|---|---|
| JP | 4-256845 | 9/1992 |
| JP | 6-128764 | 5/1994 |

* cited by examiner

*Primary Examiner*—Christine Oda
*Assistant Examiner*—James Kerveros
(74) *Attorney, Agent, or Firm*—Fitzpatrick, Cella, Harper & Scinto

(57) ABSTRACT

A plasma density measuring method which includes producing a surface wave at an interface between a dielectric member and a plasma, and measuring at least one of a plasma density and a relative change in plasma density, on the basis of the surface wave. A plasma processing system including a container having a window, and for storing therein a gas introduced thereinto, a dielectric member for closing the window of the container, a plasma voltage source for applying a high frequency voltage through the dielectric member to produce a plasma by use of the gas inside the container, wherein a predetermined process is performed by use of the thus produced plasma, a detecting system for detecting an electric field intensity distribution of a surface wave propagated through the dielectric member, and a feedback system for feeding back the result of detection by the detecting system, to determine a processing condition for the process.

18 Claims, 6 Drawing Sheets

PLASMA DENSITY MEASURING METHOD AND APPARATUS, AND PLASMA PROCESSING SYSTEM USING THE SAME

FIELD OF THE INVENTION AND RELATED ART

This invention relates to plasma density measuring method and apparatus for use in an apparatus for producing a plasma by introducing a high frequency electric power through a dielectric member.

Conventional plasma density measuring methods are mainly based on inserting a probe into a plasma.

As an example, Basics of Plasma Engineering (Akasaki, et al., Sangyo Tosho Shuppan, p207) describes a method of measuring plasma density and temperature by using a Langmuir probe. FIG. 1 shows a plasma density measuring apparatus using a Langmuir probe. In FIG. 1, denoted at 301 is an annular wave guide tube, and denoted at 302 is a slot antenna. Denoted at 303 is a dielectric member, and denoted at 304 is a vacuum container having a window as closed by the dielectric member 303. Denoted at 305 is a plasma, and denoted at 306 is a Langmuir probe. Denoted at 307 is an ammeter, and denoted at 308 is a voltage source. In this Langmuir probe 306, an electric voltage is applied to a probe as inserted into the plasma 305, and charged particles within the plasma 305 as flown into the probe are detected as an electric current. Thus, from the voltage dependency of the probe current, the electron density of the plasma as well as the electron temperature, for example, can be detected.

However, in the Langmuir probe 306, the free end of the probe for measuring the electric current is made of metal. This raises various inconveniences such as etching of the probe by a corrosive gas plasma, deposition of an insulating film on the probe surface due to a depositing gas plasma, introduction of metal contamination into a processing chamber, and disturbance of the plasma 305, for example.

As an attempt to solving these problems, a plasma absorbing probe was proposed as a contamination free probe, in 59th Autumn Academic Lecture 15p-C-17 of Japanese Association of Applied Physics, 1998. The structure and the principle of such probe are as follows. A dielectric material tube with its free end closed is inserted into a plasma, while a coaxial cable is inserted into the dielectric material tube. A high frequency wave is applied to the coaxial cable, and the frequency thereof is then changed. In response to it, a surface wave plasma is produced at the interface between the dielectric member and the plasma, with a frequency corresponding to the plasma density, and thus the absorption of a high frequency power occurs. By measuring the frequency with which the absorption occurs, the plasma density can be calculated. The relation between the plasma density $n_e$ and the absorption frequency $f_{sw}$ can be expressed by the following equation:

$$n_e = \epsilon_0 m_e (1+\epsilon_r)(2\pi f_{sw}/e)^2$$

With such a plasma absorbing probe, two of the inconveniences involved in the Langmuir probe, that is, probe etching due to the corrosive gas plasma and deposition of an insulating film on the probe surface by a depositing gas plasma, are improved significantly. Also, the introduction of metal contamination into the processing chamber can be prevented completely. However, the problem of plasma disturbance is still unsolved. Particularly, where probe inserted (in-situ) monitoring of a plasma for use in a production machine is to be executed, the insertion of the probe directly causes degradation of the uniformity of processing, and therefore, it is impractical. In consideration of this, a few proposals for measuring the state of a plasma without contact thereto have been proposed.

As an example of non-contact type plasma density measuring method, Japanese Laid-Open Patent Application, Laid-Open No. 256845/1992, discloses a microwave interference type plasma density measuring method. This method is based on the phenomenon that a microwave propagated through a plasma has a phase shift as compared with a microwave propagated through an atmosphere. The phase difference $\Delta\Phi$ of an electromagnetic wave passed through a plasma has a relation with the plasma density net as follows:

$$\Delta\Phi = l\omega_{pe}^2 / 2c\omega_0$$

$$\omega_{pe}^2 = e^2 n_e / \epsilon_0 m_e$$

where l is the length of the plasma to be passed through, c is the light speed, $\omega_0$ is the wavelength of the electromagnetic wave in a vacuum, e is the elementary charge, and $\epsilon_0$ is the dielectric constant.

In this method, the produced microwave is divided into two paths. One of the paths passes through the plasma and, after that, it is re-combined with the other, whereby interference is produced. As regards the microwave passing through the plasma, the phase thereof changes in accordance with the dielectric constant thereof. Thus, when it is caused to interfere with the microwave passed through the atmosphere and by measuring the waveform thereof, the plasma dielectric constant can be detected on the basis of the phase change in the plasma. As a result, the plasma density can be obtained.

As a similar example, Japanese Lald-Open Patent Application, Laid-Open No. 128764/1994, shows a method using laser interference.

This is a completely non-contact method and thus it does not produce a plasma disturbance. However, the measuring apparatus becomes very large. Also, there is a restriction that a window must be provided at a position opposed to the chamber. Further, the adjustment of the microwave path is not easy. For these reasons, practically it is very difficult to incorporate this measuring unit into a production machine.

As described above, with conventional plasma density measuring methods using probes, at least the problem of plasma disturbance inevitably occurs.

Further, with conventional plasma density measuring methods using microwave interference, while the problem of disturbance can be avoided because it is non-contact to the plasma, there still remain inconveniences such as that the measuring system is very large. It is therefore practically very difficult to incorporate the unit into a production machine.

SUMMARY OF THE INVENTION

It is an object of the present invention to provide a plasma density measuring apparatus and/or a plasma density measuring method with which plasma disturbance can be avoided and the unit can be made compact and thus it can be easily incorporated into a production machine.

It is another object of the present invention to provide a plasma processing system and/or a plasma processing method, which uses the plasma density measuring method and apparatus as described above.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

In accordance with investigations made by the inventor of the subject application to solve the inconveniences involved in conventional plasma density measuring methods and apparatuses and also to achieve the above-described objects, it has been found that, in a plasma processing system wherein a plasma is produced by introducing a high frequency wave, through a dielectric member, into a vacuum container having a window closed by that dielectric member, the plasma density and a relative change thereof can be measured by detecting an electric field intensity distribution of a surface wave propagated inside the dielectric member.

Figure 1:
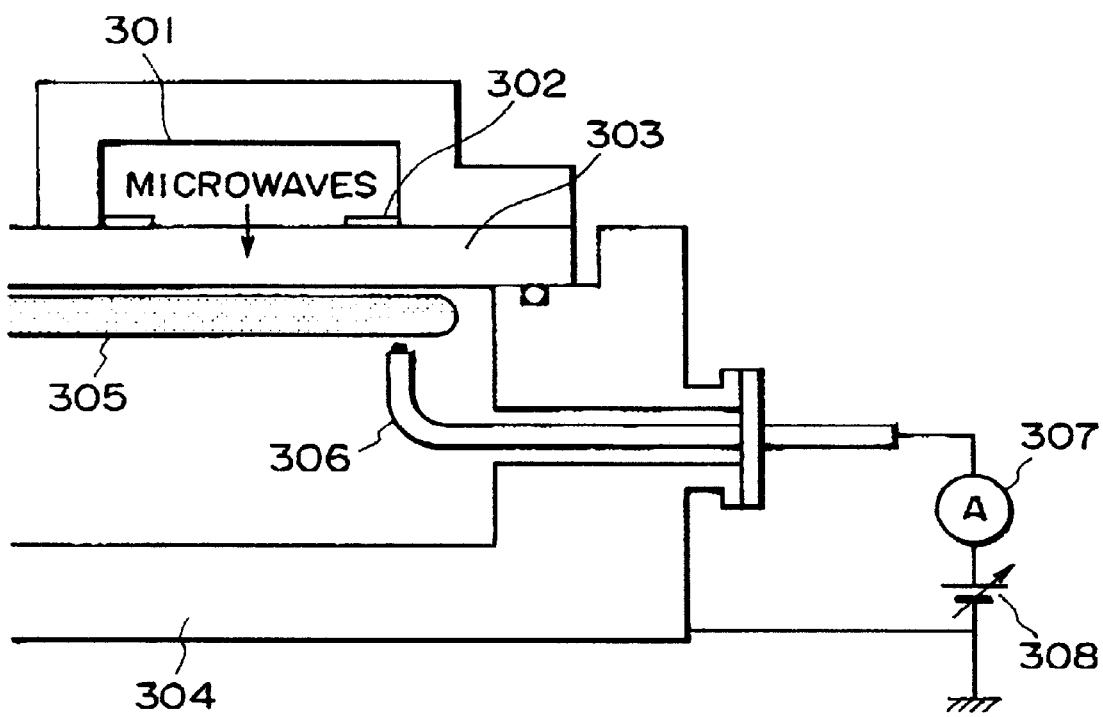
FIG. 1 is a schematic view for explaining the principle of plasma density measurement using a conventional Langmuir probe.
Figure 2:
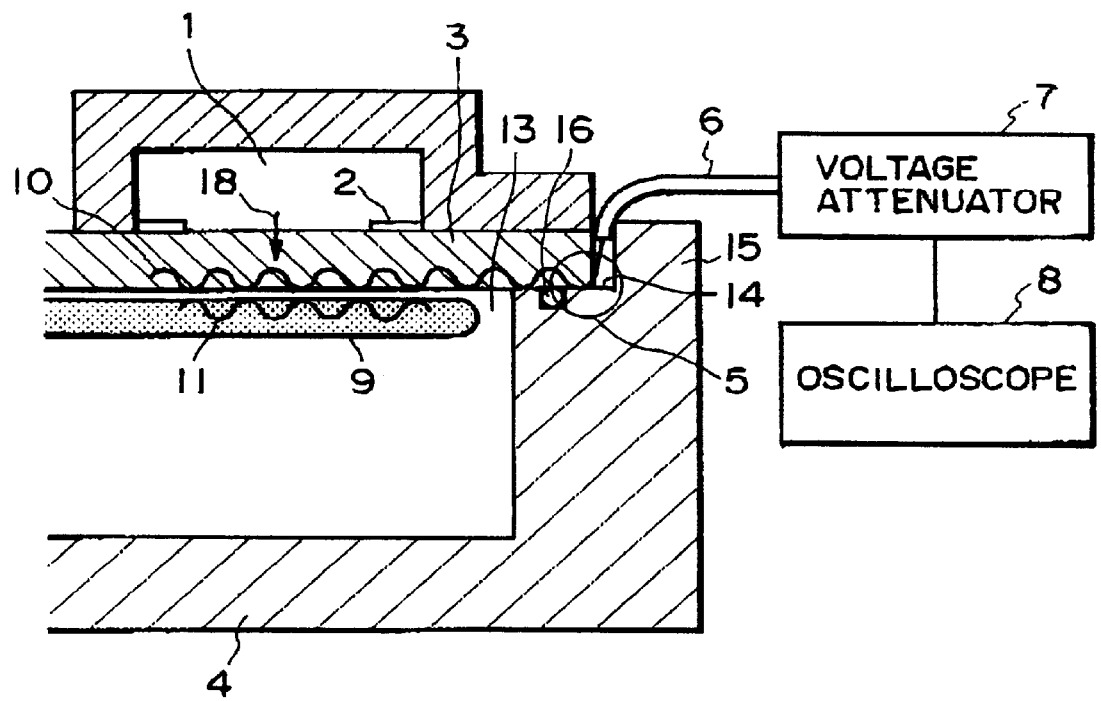
FIG. 2 is a sectional view, schematically illustrating the measurement principle in a plasma density measuring apparatus according to an embodiment of the present inventions

An embodiment of a plasma density measuring method and apparatus according to the present invention will now be described with reference to FIG. 2. FIG. 2 is a sectional view, schematically illustrating a surface wave interference type plasma processing system according to an embodiment of the present invention. Denoted at 1 in FIG. 2 is an annular wave guide tube, and denoted at 2 is a slot antenna. Denoted at 3 is a dielectric member of disk-like shape, and denoted at 4 is a vacuum container. Denoted at 5 is a surface wave detecting antenna, and denoted at 6 is a coaxial cable. Denoted at 7 is a voltage attenuator, and denoted at 8 is an oscilloscope. Denoted at 9 is a plasma, and denoted at 10 is a surface wave inside the dielectric member. Denoted at 11 is a surface wave in the plasma.

The vacuum container 4 has a window 13 as closed by the dielectric member 3, a flat annular seat 14 around the window 13, and an annular and protruded wall 15 which surrounds the annular seat 14. An O-ring 16 is fitted into an annular groove formed around the window 13. As the inside face of the dielectric member 3 engages with the FIG. 16, the inside is sealed against the outside. Also in the vacuum container 4, there is a gap defined between the inside peripheral surface of the annular and protruded wall 15 and the outside peripheral surface of the dielectric member 3. A free end of the coaxial cable 6 is put into this gap.

In operation, first, the inside of the vacuum container 4 is evacuated by means to a turbo molecular pump (not shown) and, after that, a gas is introduced into the container. By adjusting a variable conductance valve (not shown), a predetermined pressure is set. Subsequently, by means of the slot antenna 2 being opened at the bottom of the annular wave guide tube 1 which is coaxially placed at the outside surface side of the dielectric member 3, a 2.45 GHz microwave 18 is emitted into the inside of the vacuum container 4 through the dielectric member 3. As the plasma 9 is produced inside the vacuum container 4, under a certain condition, surface waves 10 and 11 are produced at the interface between the dielectric member 3 and the plasma 9, and they are propagated through the interface. The surface wave 10 is present in the dielectric member 3, while the surface wave 11 is present within the plasma 9. These surface waves are electromagnetic waves, being continuous at the interface.

As the distance from the interface along the perpendicular direction increases, the intensity of the surface wave 10 or 11 is attenuated largely. Namely, the surface wave 10 in the dielectric member 3 is locally present at the dielectric member 3 surface on the plasma 9 side, and it defines a standing wave having a node at the end of the dielectric member 3.

Figure 3:
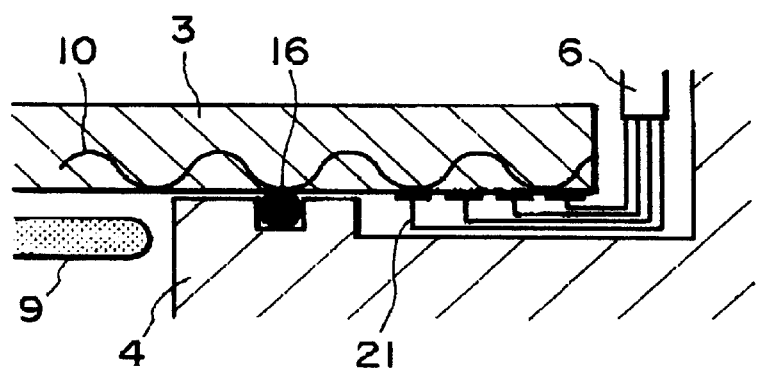
FIG. 3 is a side view, illustrating details of a surface wave detecting antenna in a plasma density measuring apparatus according to an embodiment of the present invention.
Figure 4:
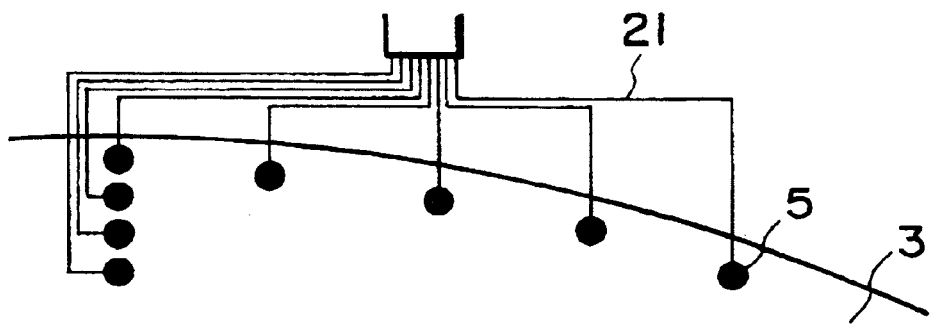
FIG. 4 is a bottom view of a dielectric member shown in FIG. 3.

The signal of this surface wave 10 is detected by using surface wave detecting antennas means 5 provided at the surface of the dielectric member 3. FIGS. 3 and 4 show details of this surface wave detecting antenna means 5. In FIGS. 3 and 4, like numerals as those of FIG. 2 are assigned to corresponding elements. Denoted at 21 is a signal pickup cable. As shown in the drawings, there are plural surface wave detecting antennas 5 disposed along circumferential and radial directions. Plural surface wave detecting antennas 5 may preferably be assembled upon a single board, because of easy handling. As regards the shape of the surface wave detecting antenna 5, a flat shape or a loop-like shape may be used, for example. However, any other shape may be used, provided that the surface wave signal can be detected thereby. The signal is picked up outwardly, from the antenna 5 and through the coaxial cable 6, and then the intensity of the signal is measured by means of the oscilloscope 8. In place of such oscilloscope, a high frequency peak voltage detecting circuit such as a peak value rectifying voltmeter, for example, may be used with similar advantageous results. Where the intensity of the surface wave signal is large, a voltage attenuator 7 may be used, as required. The signal intensities obtained through the respective antennas 5 correspond to the electric field intensity of the surface wave 10 at the respective positions of the antennas 5. Subsequently, on the basis of the signals obtained through these antennas 5, the wavelength of the surface wave 10 with respect to the radial direction and the circumferential direction is calculated. From the wavelength thus obtained by this calculation, the number of antinodes or loops of the standing wave of the surface wave 10 with respect to the radial direction and the circumferential direction can be detected.

As regards the surface wave plasma in a case where a dielectric member has a disk-like shape and where there is a single slot antenna disposed at the center, theoretical analysis is made in a paper, Surface Wave Eigenmodes in a Finite Area Plane Microwave Plasma, I. Chanashev, M. Nagatsu & H. Sugai, JJAP Vol. 36(1997), p337. It can be determined with respect to a TM wave, as follows:

$$e^2 n_e / \epsilon_0 m_e = \omega_{sw}^2 [1 - 1/\{(\omega_{sw}^2/2c^2k^2 \pm \sqrt{\{\omega_{sw}^4/4c^4k^4 + \gamma_d^2/\epsilon_d^2 k^2 \cdot \tan h^2(\gamma_d \cdot d)\}\}]$$

where $n_e$ is the electron density, $\in_0$ is the dielectric constant in the vacuum, $m_e$ is the electron mass, $\in_d$ is the relative dielectric constant of the dielectric member, e is the electric charge of electron, c is the light speed, d is the thickness of the dielectric member, k is the number of waves of the surface wave, and $\gamma_d$ is the attenuation coefficient of the electromagnetic wave inside the dielectric member The frequency $f_{SW}=\omega_{SW}/2\pi$ is the same as the frequency of the high frequency wave applied as an input and, in this example, it is 2.45 GHz. The wave number k can be expressed by using an n-th power root of an m-th order Bessel function and the radius R of the dielectric member, as follows:

$$k_{mn}=j_{mn}/R$$

where m and n represent modes of the surface wave, and they corresponds to the number of antinodes or loops of the standing wave of the surface wave with respect to the radial direction and the circumferential direction.

Also, the attenuation coefficient $\gamma_d$ can be given as follows:

$$\gamma_d=-\sqrt{(k^2-\in_d\omega_{SW}^2/c^2)}$$

As described above, since there is a correlation between the mode of the surface wave and the electron density, by measuring the wavelengths of the surface wave 10 being propagated through the dielectric member, with respect to the radial direction and the circumferential direction, and by determining the mode of the surface wave 10, the density of the plasma 9 as produced at the surface of the dielectric member 3 can be monitored without contact thereto and also in a real time fashion.

The above-described theory is applicable only to an idealistic case wherein only a single mode surface wave is excited. With a practical plasma source, a surface wave is excited with different modes being superposed, such that it cannot be explained by linear superposition of single modes. In consideration of it, practically, the plasma density has to be detected by comparing an electric field distribution as obtained by simulation and an actual electric field distribution. More specifically, simulations may be performed beforehand with various parameters (e.g., window radius, dielectric constant, slot position or slot shape) having influences to the surface wave electric field distribution being fixed in a practical condition while the dielectric constant of the plasma is changed. The electric field distribution as produced at the end of the dielectric member is monitored and, on the basis of the simulation result which matches the measured distribution, the electron density is detected. By using a database of correlation between the electric field intensity and the electron density obtained by the simulation, the electron density can be detected promptly from the measured electric field density.

Figure 5:
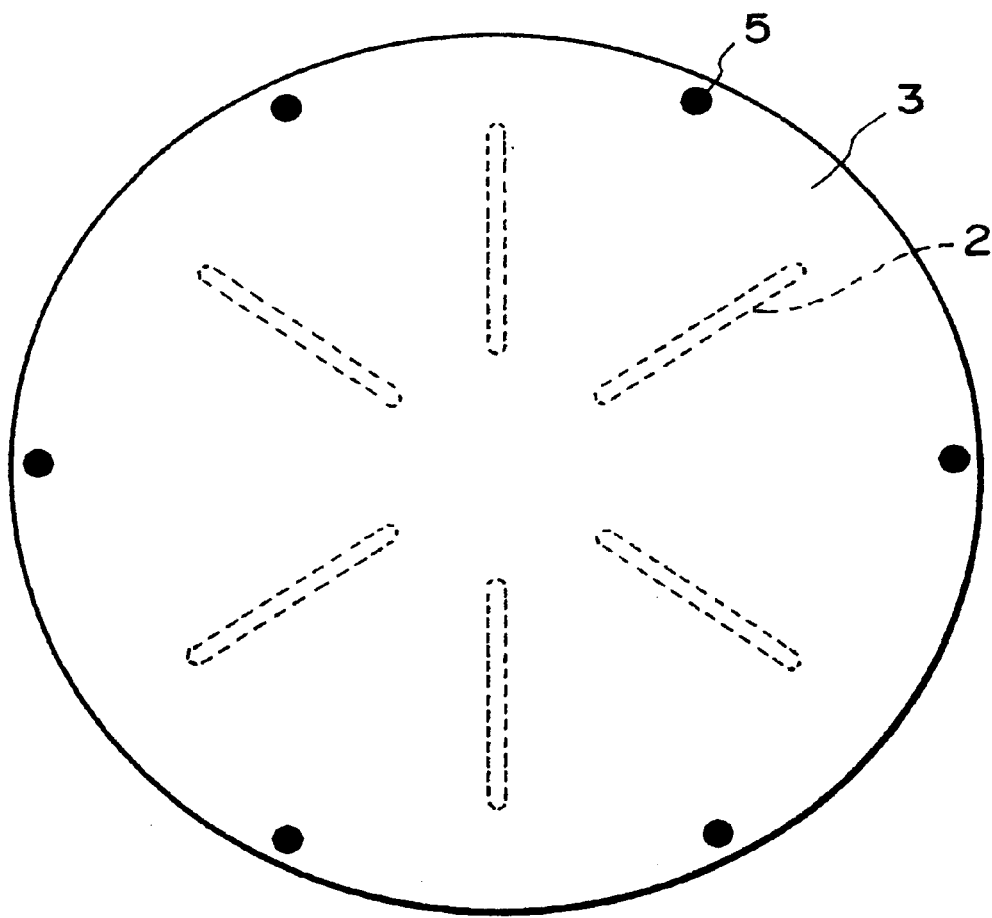
FIG. 5 is a bottom view, illustrating disposition of surface wave detecting antennas in an embodiment of the present invention.

As described above, by performing simulations while fixing the discharging condition and by detecting the correlation between the electron density and the electric field intensity of the surface wave, the electron density can be determined exactly. In practical apparatuses, however, the discharging condition may gradually change due to reduction or erosion of the dielectric member or deposition of a film inside the vacuum container, for example, so that the correlation between the electron density and the electric field intensity initially obtain may shift gradually. It may be therefore difficult to measure an absolute value of the electron density accurately for a long term- In consideration of it, practically, the electric field intensity may be monitored continuously and a relative change in the electron density may be detected on the basis of such change with respect to time. For example, where the dielectric member is etched such that the thickness thereof gradually decreases, the plasma density becomes higher because the loss of the high frequency voltage applied becomes smaller. Such a change can be detected as an increase of the electric field intensity of the surface wave. Further, if a film is locally deposited and It causes a decrease of the plasma density, the surface wave electric filed intensity in the direction in which the plasma density has decreased also decreases. In consideration of it, plural antennas may be provided along the circumferential direction, and the electric field density may be monitored by using them. With this structure, any abnormality in uniformness can be detected. FIG. 5 is a bottom view, illustrating an example of a layout of surface wave detecting antennas, being arranged for this purpose. In FIG. 5, denoted at 2 are slot antennas provided on the top face, and denoted at 3 is a dielectric member. Denoted at 5 are surface wave detecting antennas. In this drawing, each surface wave detecting antenna 5 is disposed at a position rotated by 30 deg. from a corresponding slot antenna 2. If the measurement is performed at the position where the surface wave electric field intensity is strongest, a change can be measured with a highest sensitivity. The position of highest electric field intensity can be detected on the basis of observation of a light emission pattern of the plasma 9 or through simulations.

A measuring system according to an embodiment of the present invention basically comprises surface wave detecting antennas 5 provided on a dielectric member 3, and a signal pickup coaxial cable 6 as well as an oscilloscope 6 being commercially available. Thus, the structure is very simple. Therefore, it can be applied very easily to any type of plasma source. provided that it uses a discharging principle of introducing a high frequency wave through a dielectric member 3 and that a surface wave is excited at the interface between the dielectric member and the plasma.

Further, a relative change of a plasma density or a distribution thereof along a plane as measured by using the measuring system of the present invention may be fed back to a process condition, by which a change in etching speed with respect to time or a change in distribution along the plane can be maintained constant very precisely.

Figure 6:
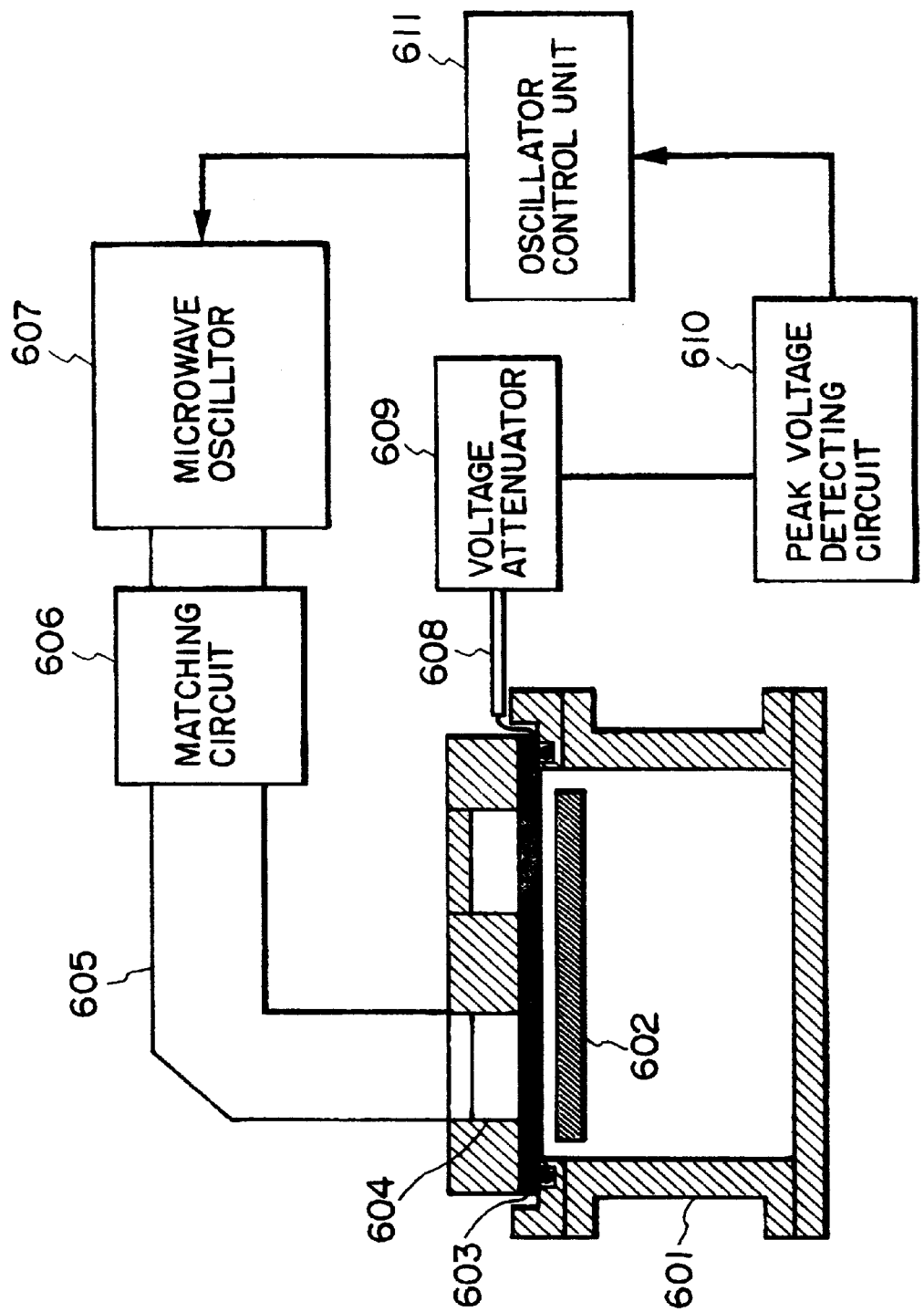
FIG. 6 is a schematic and diagrammatic view for explaining a plasma processing system according to an embodiment of the present invention.

FIG. 6 shows an example of the structure for measuring a change of plasma density with respect to time and for feeding back the same to a process condition. In FIG. 6, denoted at 601 is a vacuum container, and denoted at 602 is a plasma. Denoted at 603 is a dielectric material window, and denoted at 604 is an annular wave guide tube. Denoted at 605 is a wave guide tube, and denoted at 606 is a matching circuit. Denoted at 607 is a microwave oscillator, and denoted at 608 is a surface wave detecting antenna. Denoted at 609 is a voltage attenuator, and denoted at 610 is a peak voltage detecting circuit. Denoted at 611 is a microwave oscillator control unit. The density of a plasma being discharged is detected, as a surface wave signal at the dielectric member surface, by the surface wave detecting antenna 608. In response, the peak voltage detecting circuit 610 produces and outputs a voltage value which is proportional to the peak intensity of the detected signal. As regards a circuit for detecting the peak voltage of a surface wave signal which is an AC signal, an oscilloscope may not be used and, in place thereof, a simple peak value rectifying voltmeter may be used, for example, by which an output of a voltage proportional to the peak intensity can be produced. Additionally, any other circuit may be used provided that it can detect a high frequency wave peak voltage.

The microwave oscillator control unit 611 compares distributions of signal intensities obtained through plural antennas, with a simulation result, to determine the plasma density. It is then compared with a set value of density. If the detected density is lower, the power of the microwave is increased by the control unit. If the density is higher, the microwave power is decreased.

Figure 7:
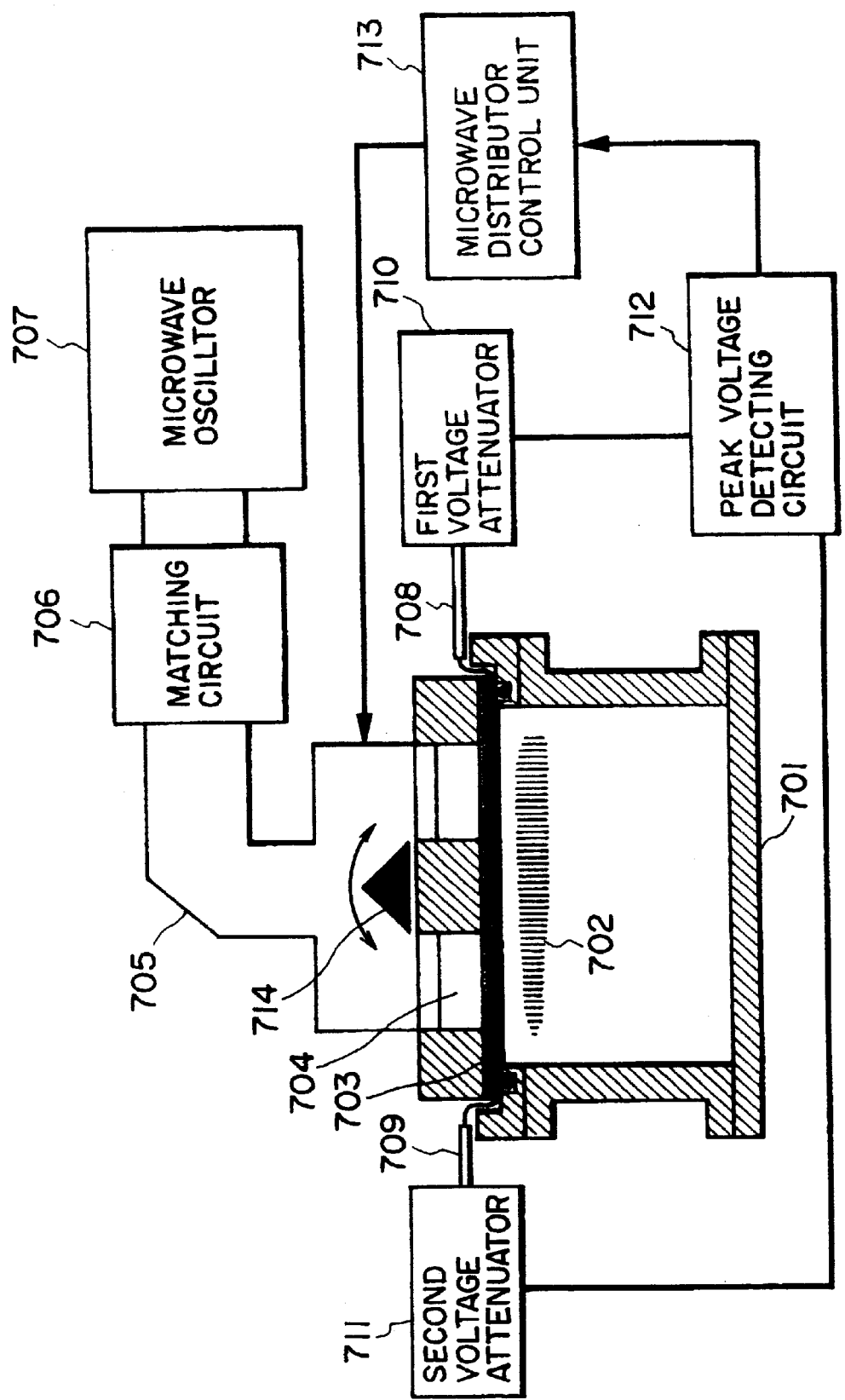
FIG. 7 is a schematic and diagrammatic view for explaining plasma processing system according to another embodiment of the present invention.

FIG. 7 shows an example of the structure for measuring a distribution of plasma density along a plane and for feeding back the same to a process condition. In FIG. 7, denoted at 701 is a vacuum container, and denoted at 702 is a plasma. Denoted at 703 is a dielectric material window, and denoted at 704 is an annular wave guide tube. Denoted at 705 is a wave guide tube, and denoted at 706 is a matching circuit. Denoted at 707 is a microwave oscillator. Denoted 708 is a first surface wave detecting antenna. and denoted at 709 is a second surface wave detecting antenna. Denoted at 710 is a first voltage attenuator, and denoted at 711 is a second voltage attenuator. Denoted at 712 is a peak voltage detecting circuit, and denoted at 713 is a microwave distributor control unit. Denoted at 714 is a microwave distributor. The first and second surface wave detecting antennas 708 and 709 are disposed at the outer circumference portions of the dielectric member window 703 where two wave guide paths separated by the microwave distributor 714 are connected to the annular wave guide tube 704.

Figure 8:
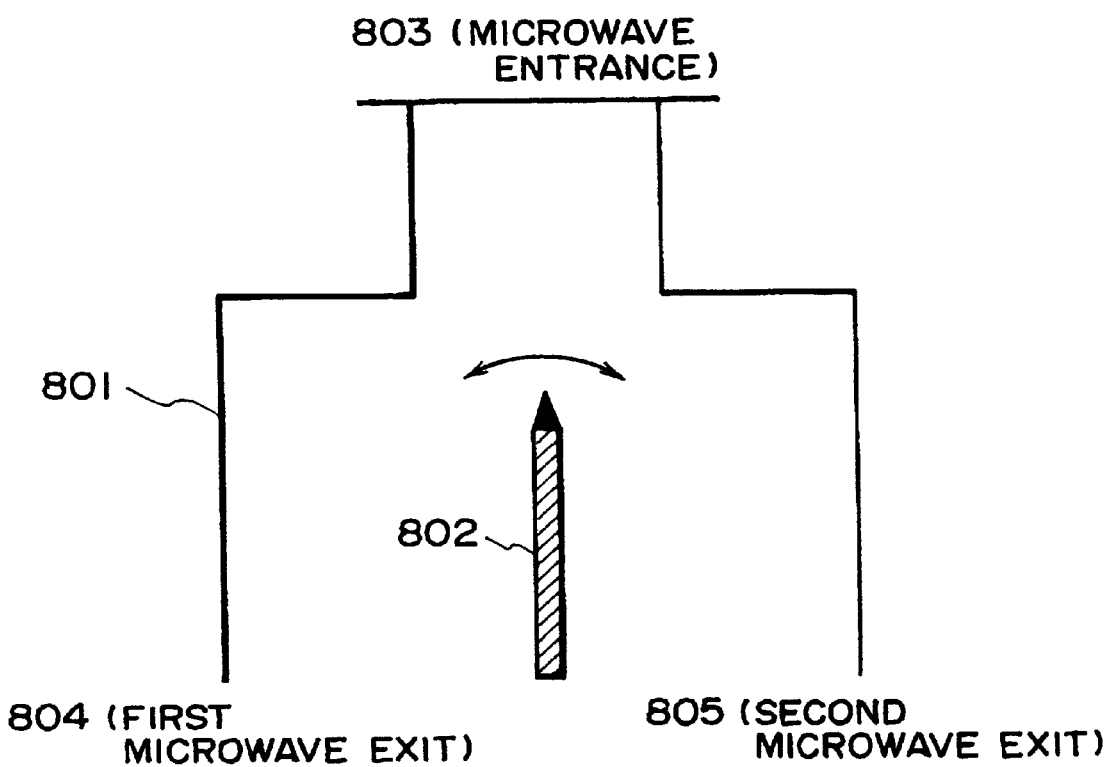
FIG. 8 is a schematic view for explaining a distribution proportion adjusting method in a microwave distributor in an embodiment of the present invention.

The distribution of a density of plasma being discharged is detected, as a distribution of surface wave signals at the dielectric member window 703 surface, by means of the first and second surface wave detecting antennas 708 and 709. In response, the peak voltage detecting circuit 712 produces and outputs a voltage value which is proportional to the signal peak intensity. The microwave distributor control unit 713 compares the signal intensities from the first and second surface wave detecting antennas 708 and 709 with each other, and it adjusts the microwave distributor 714 so that the intensities of these signals become the same level. FIG. 8 schematically illustrates the method of adjusting the distribution proportion at the microwave distributor 714 and, in this example, a movable distributing plate is disposed at the center of an H-split. In FIG. 8, denoted at 801 is an H-split in the wave guide tube, and denoted at 802 is a movable distributing plate. Denoted at 803 is a microwave entrance port. Denoted at 804 is a first microwave exit port, and denoted at 805 is a second microwave exit port By moving the distributing plate 802, a larger quantity of microwave voltage power is supplied into one of the wave guide tubes having a sectional area enlarged with the motion of the plate. For example, if the surface wave electric field intensity at the first microwave exit port 804 side, that is, the plasma density there, decreases, the distributing plate 802 is moved toward the second microwave exit port 805 side, by which the microwave supplying voltage power at the first microwave exit port 804 side is enlarged. As a result of it, the plasma density at the first microwave exit port 804 side increases, such that a plasma being uniform along the circumferential direction can be accomplished.

Although in this example the wave guide tube is divided into two branches, it may be divided into three or more, with a similar advantageous result.

Now, specific examples of plasma density measuring method and apparatus according to the present invention will be described. It should be noted however that the present invention is not limited to these examples.

EXAMPLE 1

A first example of the present invention will be explained with reference to a case where a plasma density in a surface wave interference type plasma processing apparatus is the subject of measurement. The structure of a surface wave plasma processing apparatus in this embodiment may be similar to that shown in FIG. 2. As regards a dielectric member 3, a quartz material of disk-like shape having a diameter 280 mm and a thickness 14 mm was used. Slot antennas 2 comprised eight slots disposed radially with 45 deg. intervals. Surface wave detecting antennas 5 were O-ring provided at the atmosphere side (outside an O-ring 16) of the circumferential portion of the dielectric member 3, and they were connected to a voltage attenuator 7 of 1/1000, through cables 6. The output of the attenuator was connected to an oscilloscope 8. As regards the antennas 5, twenty antennas were provided at a radial position of 135 mm of the dielectric member 3, and they were disposed circumferentially with 5 mm intervals.

First an Ar gas of 200 sccm (volume $cm^3$ in a standard state) was introduced into the vacuum container 4 having been evacuated by means of a turbo molecular pump (not shown). A variable conductance valve (not shown) was adjusted, and the pressure was set to 100 Pa. Subsequently, by means of a 2.45 GHz microwave voltage source (not shown), microwaves of 1 kW were oscillated. They were emitted into the vacuum container 4, from the slot antennas 2 being opened at the bottom of the annular wave guide tube 1, and through the dielectric member 3. As a result, a surface wave plasma 9 was produced.

Subsequently, by using the oscilloscope 8, the surface wave signal intensity was measured. From the results of voltage measurements along the circumferential direction, three peaks were observed among the slots.

The simulation result and the electric field intensity distribution pattern observed were compared with each other, and it was confirmed that best registration was obtained with a plasma density of $1.8 \times 10^{12}/cm^3$.

Subsequently, a Langmuir probe was inserted into the vacuum container 4, and the plasma density at a point spaced by 10 mm from the dielectric member 3 was measured. As a result, a plasma density of $6.0 \times 10^{11}/cm^3$ was obtained. This supported the numerical value of the plasma density near the dielectric member 3 as determined by calculation.

EXAMPLE 2

A second example of the present invention will be described with reference to a case where the plasma density in a surface wave interference type plasma processing is the subject of measurement and where the uniformness of a plasma in a circumferential direction is to be specifically measured. The structure of a surface wave plasma processing apparatus of this embodiment may be similar to that shown in FIG. 2. As regards a dielectric member 3, a quartz material of disk-like shape having a diameter 280 mm and a thickness 14 mm was used. Slot antennas 2 comprised six slots disposed radially with 60 deg. intervals. Surface wave detecting antennas 5 were provided at the atmosphere side (outside an O-ring 16) of the circumferential portion of the dielectric member 3, and they were connected to a voltage attenuator 7 of 1/1000, through cables 6. The output of the attenuator was connected to an oscilloscope 8. As regards the antennas 5, six antennas were provided along a circumferential direction, with 60 deg. intervals, in a similar manner as shown in FIG. 4, each being disposed at a position rotated by 30 deg. from the slot antenna 2.

First, an Ar gas of 200 sccm was introduced into the vacuum container 4 having been evacuated by means of a turbo molecular pump (not shown) A variable conductance valve (not shown) was adjusted, and the pressure was set to 10 Pa. Subsequently, by means of a 2.45 GHz microwave voltage source (not shown), microwaves of 1 kW were oscillated. They were emitted into the vacuum container 4, from the slot antennas 2 being opened at the bottom of the annular wave guide tube 1, and through the dielectric member 3. As a result, a surface wave plasma 9 was produced. As the light emission patterns from the surface wave plasma 9 were observed by naked eyes from an observation window, it was confirmed that there were produced portions with a strong light emission intensity, of a number 2 (two) in the radial direction and 18 (eighteen in the circumferential direction.

Subsequently, by using the oscilloscope 8, the surface wave signal intensity was measured. As regards the voltage measured values at six measurement points set equiangularly along the circumferential direction, it was 122 mV at the measurement point 1, 124 mV at the measurement point 2, 120 mV at the measurement point 3, 119 mV at the measurement point 4, 114 mV at the measurement point 5, and 120 mV at the measurement point 6. The measurements were made at the positions of 135 mm from the center of the dielectric member 3. From the results above, it was confirmed that the electric field intensity was stronger at the position of the measurement point 2 and it was lower at the position of the measurement point 5.

The uniformness of the electric field intensity was 3.3%. Subsequently, a wafer which comprised an 8-inch Si substrate having a photoresist applied thereto with a thickness 5000 angstroms was placed in the apparatus. A similar Ar plasma was produced and the distribution, along the surface, of the photoresist etching speed by the Ar plasma was measured. As a result, it was confirmed that the etching speed was higher in the direction of the measurement point 2 (with higher electric field intensity) and it was lower in the direction of the measurement point 5 (with lower electric field intensity). The etching speed uniformness along the surface was 2.6%.

As described, since there is a strong correlation between the etching speed distribution along the surface and the electric field intensity distribution, the uniformness of the etching speed can be predicted by monitoring the electric field intensity distribution, and it can be done without measurement of a film thickness on a wafer after the etching process.

EXAMPLE 3

A third example of the present invention will be explained with reference to a case where a plasma density in a surface wave interference type plasma processing apparatus is the subject of measurement and where a change of plasma density with respect to time is to be specifically measured. The structure of a surface wave plasma processing apparatus in this embodiment may be similar to that shown in FIG. 2. As regards a dielectric member 3, a quartz material of disk-like shape having a diameter 280 mm and a thickness 14 mm was used. Slot antennas 2 comprised six slots disposed radially with 60 deg. intervals. Surface wave detecting antennas 5 were provided at the atmosphere side (outside an O-ring 16) of the circumferential portion of the dielectric member 3, and they were connected to a voltage attenuator 7 of 1/1000, through cables 6. The output of the attenuator was connected to an oscilloscope 8.

First, an Ar gas of 200 sccm was introduced into the vacuum container 4 having been evacuated by means of a turbo molecular pump (not shown). A variable conductance valve (not shown) was adjusted, and the pressure was set to 10 Pa. Subsequently, by means of a 2.45 GHz microwave voltage source (not shown), microwaves of 1 kW were oscillated. They were emitted into the vacuum container 4, from the slot antennas 2 being opened at the bottom of the annular wave guide tube 1, and through the dielectric member 3. As a result, a surface wave plasma 9 was produced. As the light emission patterns from the surface wave plasma 9 were observed by naked eyes from an observation window, it was confirmed that there were produced portions with a strong light emission intensity, of a number 2 (two) in the radial direction and 18 (eighteen in the circumferential direction.

Subsequently, by using the oscilloscope 8, the surface wave signal intensity was measured. The voltage measured value was 120 mV.

The measurement was made at the position of 135 mm from the center of the dielectric member 3. Subsequently, a wafer which comprised an 8-inch Si substrate having a photoresist applied thereto with a thickness 5000 angstroms was placed in the apparatus. A similar Ar plasma was produced and the photoresist etching speed by the Ar plasma was measured. As a result, it was confirmed that a value 200 angstroms per minute was obtained. Subsequently, Ar discharging of 200 hours was performed interruptedly. During the discharging, the surface wave electric field intensity increased gradually and, after 200 hours, it reached 124 mV which was 3.3% higher than the original level. The etching speed of the photoresist at that time was 211 angstroms per minute.

As described, since there is a strong correlation between the etching speed and the electric field intensity, any variation in the etching speed can be predicted by monitoring the electric field intensity, and it can be done without measurement of a film thickness on a wafer after the etching process.

EXAMPLE 4

In a fourth example, the present invention is applied to a surface wave interference type plasma processing apparatus to measure a plasma density so that it is fed back to the microwave power. The structure of a surface wave plasma processing apparatus in this embodiment may be similar to that shown in FIG. 6. As regards a dielectric member window, a quartz member having a diameter 280 mm and a thickness 14 mm was used. Slot antennas comprised six slots disposed radially with 60 deg. intervals. Surface wave detecting antennas were provided at the atmosphere side (outside an O-ring) of the circumferential portion of the dielectric member, and they were connected to a peak voltage detecting circuit through a voltage attenuator of 1/1000 and cables. The output thereof was then connected to a microwave oscillator control unit. The microwave oscillator control unit had a PID control circuit incorporated therein, to change the microwave output so that the surface wave signal intensity became stably constant.

First, a $C_4F_8$/Ar gas was introduced into the vacuum container 4 having been evacuated by means of a turbo molecular pump (not shown), at a flow rate of 15/185 sccm. A variable conductance valve (not shown) was adjusted, and the pressure was set to 10 Pa.

Subsequently, by means of a 2.45 GHz microwave voltage source (not shown), microwaves were oscillated. They were emitted into the vacuum container, from the slot antennas being opened at the bottom of the annular wave guide tube, and through the dielectric member. The output of the microwave oscillator was controlled so that the surface wave signal intensity was kept constant at 150 mV. The actual output was 1.45 KW. As the light emission patterns from the surface wave plasma were observed by naked eyes from an observation window, it was confirmed that there were produced portions with a strong light emission intensity, of a number 2 (two) in the radial direction and 18 (eighteen in the circumferential direction.

Subsequently, a wafer which comprised an 8-inch Si substrate having a photoresist applied thereto with a thickness 500 nm was placed in the apparatus. A similar $C_4F_8$/Ar plasma was produced and the photoresist etching speed by that plasma was measured. As a result, it was confirmed that a value 208 nm per minute was obtained.

Subsequently, $C_4F_8$/Ar discharging of 200 hours was performed interruptedly. During the discharging, the output value of the microwave gradually decreased from 1.45 kW to 1.37 kW, but the surface wave signal intensity was held continuously at a constant level of 150 mV. After 200 hours, as the surface of the quartz window was observed, it was confirmed that the thickness decreased by about 2 mm by etching. The photoresist etching speed in that state was measured again, and a value 210 nm per minute was obtained. Further, the feedback control was discontinued and a voltage 1.45 kW corresponding to the original microwave power was applied The result was that the surface wave signal intensity increased to 162 mV and, due to it, the photoresist etching speed was raised to 228 nm per minute.

As described, by adjusting the microwave output so as to keep the surface wave electric field intensity stably constant the etching speed can be held stably constant.

EXAMPLE 5

In a fifth example, the present invention is applied to a surface wave interference type plasma processing apparatus to measure uniformness of a plasma density along a surface, so that it is fed back to a microwave distributor. The structure of a surface wave plasma processing apparatus in this embodiment may be similar to that shown in FIG. 7. As regards a dielectric member window, a quartz member having a diameter 280 mm and a thickness 14 mm was used. Slot antennas comprised six slots disposed radially with 60 deg. intervals. Two surface wave detecting antennas were provided at the atmosphere side (outside an O-ring) of the circumferential portion of the dielectric member, and they were connected to a peak voltage detecting circuit through a voltage attenuator of 1/1000 and cables. The output thereof was then connected to a microwave oscillator control unit. The microwave oscillator control unit had a PID control circuit incorporated therein, to change the angle of a microwave distributing plate so that the surface wave signals from the two antennas were kept constantly at the same level.

First, a $C_4F_8$/Ar gas was introduced into the vacuum container having been evacuated by means of a turbo molecular pump (not shown), at a flow rate of 15/185 sccm. A variable conductance valve (not shown) was adjusted and the pressure was set to 10 Pa.

Subsequently, by means of a 2.45 GHz microwave voltage source (not shown), microwaves were oscillated. They were emitted into the vacuum container, from the slot antennas being opened at the bottom of the annular wave guide tube, and through the dielectric material window. As regards the dielectric material window, it was formed intentionally with an inclined thickness, such that the thickness of the dielectric material at one of the two microwave inlet ports was larger while the thickness at the other was smaller. As regards the thickness, it was 14 mm at the large thickness side and 12 mm at the small thickness side.

As the light emission patterns from the surface wave plasma without the distributor control were observed by naked eyes from an observation window, it was confirmed that the light emission intensity was stronger at the smaller thickness portion of the dielectric material window while it was weaker at the larger thickness portion. In that state, a wafer which comprised an 8-inch Si substrate having a photoresist applied thereto with a thickness 500 nm was placed in the apparatus. A similar $C_4F_8$/Ar plasma was produced and the photoresist etching speed by that plasma was measured. As a result, it was confirmed that a value 252 nm per minute was obtained at the small thickness portion of the dielectric material window while a value 218 nm per minute was obtained at the large thickness portion thereof. Thus, there was a large difference in etching speed.

Subsequently, under the distributor control. the light emission patterns from the surface wave plasma were observed by naked eyes from the observation window, and it was confirmed that the plasma light emission intensity was substantially at the same level between the smaller thickness portion and the large thickness portion of the dielectric material window. As regards the angle of the microwave distributing plate at that time, it was Inclined by 12 deg. toward the smaller thickness portion of the dielectric window. In that state, a wafer which comprised an 8-inch Si substrate having a photoresist applied thereto with a thickness 500 nm was placed in the apparatus. A similar $C_4F_8$/Ar plasma was produced and the photoresist etching speed by that plasma was measured. As a result, It was confirmed that a value 238 nm per minute was obtained at the small thickness portion of the dielectric material window while a value 233 nm per minute was obtained at the large thickness portion thereof. Thus, the difference in etching speed was improved significantly.

As described, by adjusting the microwave distributor so as to keep the surface wave electric field intensity constant along the surface, the uniformness of the etching speed can be improved considerably and also it can be held stably constant.

In accordance with the embodiments of the present invention as described hereinbefore, there is provided means for measuring a plasma density on the basis of a surface wave on the surface of a dielectric member, or means for measuring a relative change in plasma density. This accomplishes measurement of any change in plasma density with respect to time or uniformness thereof without causing plasma disturbance or without contact to the plasma. Further, the structure can be kept compact, and it can be easily incorporated into a production machine. Particularly when it is applied to a plasma processing apparatus or method, more convenient plasma processing can be accomplished.

While the invention has been described with reference to the structures disclosed herein, it is not confined to the details set forth and this application is intended to cover such modifications or changes as may come within the purposes of the improvements or the scope of the following claims.

What is claimed is:

1. A plasma density measuring method, said method comprising the steps of:

producing a surface wave at an interface between a dielectric member and a plasma; and measuring, by use of a detector disposed outside a vacuum container, at least one of a plasma density and a relative change in plasma density, on the basis of the surface wave.

2. A method according to claim 1, further comprising the step of applying a high frequency voltage from the dielectric member to produce a plasma with a gas, wherein the plasma density or the relative change in plasma density is measured by detecting, by use of a detector disposed outside a vacuum container, an electric field intensity distribution of the surface wave propagated through the dielectric member.

3. A method according to claim 1, wherein measurement in said measuring step relates to a plasma density in a plasma processing apparatus in which a gas is introduced into a container having a window closed by the dielectric member, and wherein a high frequency voltage is applied through the dielectric member to produce a plasma with the gas inside the container.

4. A method according to claim 3, wherein the plasma density is measured by detecting, by use of a detector disposed outside a vacuum container, an electric field intensity distribution of a surface wave propagated through the dielectric member.

5. A method according to claim 3, wherein a relative change in plasma density is measured by detecting, by use of a detector disposed outside a vacuum container, an electric field intensity distribution of a surface wave propagated through the dielectric member.

6. A method according to claim 2, wherein a signal of the surface wave propagated through the dielectric member is detected by using a surface wave detecting antenna, disposed outside a vacuum container, and wherein a signal intensity corresponding to the electric field intensity is measured by using an oscilloscope, on the basis of which the electric field intensity distribution is detected.

7. A method according to claim 2, further comprising the step of performing simulations with a parameter (i) influential to the electric field intensity distribution and (ii) set in a practical condition while a dielectric constant of the plasma is changed, wherein the plasma density is detected on the basis of a result of a simulation matched to the detected electric field intensity distribution.

8. A method of performing a process using a plasma, said method comprising the steps of:
introducing a gas into a container having a window closed by a dielectric member;
applying a high frequency voltage through the dielectric member to produce a plasma by use of the gas inside the container;
performing a predetermined process by use of the plasma;
measuring at least one of a plasma density and a relative change in plasma density, by use of a detector disposed outside a vacuum container and on the basis of a surface wave propagated through the dielectric member; and
determining a condition for the predetermined process on the basis of the measurement.

9. A method according to claim 8, wherein a signal of the surface wave propagated through the dielectric member is detected by using a surface wave detecting antenna, disposed outside a vacuum container, and wherein a signal intensity corresponding to the electric field intensity is measured by using one of an oscilloscope and a peak voltage measuring circuit, on the basis of which the electric field intensity distribution is detected.

10. A method according to claim 9, wherein the electric field intensity distribution is fed back to one of an output of a microwave voltage source and a microwave distributor.

11. A plasma density measuring system for use in an apparatus wherein a high frequency voltage is applied to a gas in a container through a dielectric member to produce a plasma by use of the gas, said measuring system comprising:
detecting means for detecting, by use of a detector disposed outside a vacuum container, an electric field intensity distribution of a surface wave propagated through the dielectric member; and
measuring means for measuring at least one of a plasma density and a relative change in plasma density on the basis of a detection by said detecting means.

12. A plasma density measuring system, comprising:
a container having a window, said container storing therein a gas introduced thereinto;
a dielectric member that closes the window of said container;
a plasma voltage source that applies a high frequency through said dielectric member to produce a plasma by use of the gas inside said container; and
a detecting system that detects, by use of a detector disposed outside a vacuum container, an electric field intensity distribution of a surface wave propagated through said dielectric member, wherein at least one of a plasma density and a relative change in plasma density is measured on the basis of a detection by said detecting system.

13. A plasma density measuring system according to claim 12, wherein said detecting system includes an antenna that detects a signal of the surface wave, and one of an oscilloscope and a peak voltage measuring circuit that measures of a signal intensity corresponding to the electric field intensity in response to reception of the surface wave signal by said antenna.

14. A plasma density measuring system according to claim 12, wherein the plasma density is detected on the basis of a result of a simulation matched to the detected electric field intensity distribution, the simulation being one of a plurality of simulations prepared beforehand and (i) having a parameter influential to the electric field intensity distribution and (ii) set in a practical condition while a dielectric constant of the plasma is changed.

15. A plasma processing system, comprising:
a container having a window, said container storing therein a gas introduced thereinto;
a dielectric member that closes the window of said container;
a plasma voltage source that applies a high frequency voltage through said dielectric member to produce a plasma by use of the gas inside said container, wherein a predetermined process is performed by use of the plasma;
a detecting system that detects, by use of a detector disposed outside a vacuum container, an electric field intensity distribution of a surface wave propagated through said dielectric member; and
a feedback system that feeds back the result of detection by said detecting system, to determine a processing condition for the process.

16. A plasma processing system according to claim 15, wherein said detecting system includes a surface wave detecting antenna, disposed outside a vacuum container, that detects a signal of the surface wave, wherein, in response to the surface wave signal, a signal intensity corresponding to the electric field intensity is measured.

17. A plasma processing system according to claim 15, wherein said feedback system includes a control circuit that feeds back the electric field intensity distribution to an output of a microwave voltage source.

18. A plasma processing system according to claim 15, wherein said feedback system includes a control circuit that feeds back the electric field intensity distribution to a microwave distributor.

* * * * *

UNITED STATES PATENT AND TRADEMARK OFFICE
CERTIFICATE OF CORRECTION

PATENT NO. : 6,541,982 B2
DATED : April 1, 2003
INVENTOR(S) : Hideo Kitagawa et al.

It is certified that error appears in the above-identified patent and that said Letters Patent is hereby corrected as shown below:

Column 5,
Line 66, "term-" should read -- term. --.

Column 6,
Line 8, "It" should read -- it --;
Line 9, "filed" should read -- field --; and
Line 34, "source." should read -- source, --.

Column 7,
Line 44, "port" should read -- port. --.

Column 8,
Line 67, "shown)" should read -- shown). --.

Column 11,
Line 6, "(eighteen" should read -- (eighteen) --.

Column 12,
Line 16, "control." should read -- control, --;
Line 23, "Inclined" should read -- inclined --; and
Line 29, "It" should read -- it --.

Signed and Sealed this

Ninth Day of December, 2003

JAMES E. ROGAN
*Director of the United States Patent and Trademark Office*